United States Patent
Kollberg et al.

(10) Patent No.: US 11,053,586 B2
(45) Date of Patent: Jul. 6, 2021

(54) COATED FLAT COMPONENT IN A CVD REACTOR

(71) Applicant: AIXTRON SE, Herzogenrath (DE)

(72) Inventors: Marcel Kollberg, Wurselen (DE); Daniel Brien, Aachen (DE)

(73) Assignee: AIXTRON SE, Herzogenrath (DE)

(*) Notice: Subject to any disclaimer, the term of this patent is extended or adjusted under 35 U.S.C. 154(b) by 657 days.

(21) Appl. No.: 15/321,660

(22) PCT Filed: Jun. 25, 2015

(86) PCT No.: PCT/EP2015/064363
§ 371 (c)(1),
(2) Date: Dec. 22, 2016

(87) PCT Pub. No.: WO2016/001053
PCT Pub. Date: Jan. 7, 2016

(65) Prior Publication Data
US 2017/0152598 A1    Jun. 1, 2017

(30) Foreign Application Priority Data
Jul. 3, 2014    (DE) ................... 10 2014 109 327.5

(51) Int. Cl.
*C23C 16/455*    (2006.01)
*C23C 16/458*    (2006.01)
(Continued)

(52) U.S. Cl.
CPC ........ *C23C 16/455* (2013.01); *C23C 16/4581* (2013.01); *C23C 16/4583* (2013.01); *C30B 25/08* (2013.01); *C30B 25/12* (2013.01)

(58) Field of Classification Search
CPC ....... C30B 25/08; C30B 25/12; C23C 16/455; C23C 16/4581; C23C 16/4583
See application file for complete search history.

(56) References Cited

U.S. PATENT DOCUMENTS 5,837,058 A * 11/1998 Chen .................. C23C 16/4581
118/728
2001/0023212 A1 * 9/2001 Horie ...................... F16G 13/04
474/212
(Continued)

FOREIGN PATENT DOCUMENTS

WO        99/43874 A1    9/1999
WO     2013/064613       5/2013

OTHER PUBLICATIONS

International Search Report dated Sep. 24, 2015, from the European Patent Office, for International Patent Application No. PCT/EP2015/064363 (filed Jun. 25, 2015), 5 pages.
(Continued)

*Primary Examiner* — Charlee J. C. Bennett
(74) *Attorney, Agent, or Firm* — Ascenda Law Group, PC

(57) ABSTRACT

A CVD reactor includes a flat component with two broad sides extending parallel to each other and spaced apart from each other by a thickness. An outer edge of each broad side transitions without kinks into an edge of an outer peripheral side of the flat component. The thickness of the flat component is substantially less than a diameter of the flat component. The flat component includes a core body composed of graphite. The core body is coated with a SiC or TaC coating, which exhibits a compressive stress at room temperature. In order to reduce the stress between the coating and the core body, the rounding arc length of the outer edge is greater than 90° and the rounding radius of the outer edge is at most 1 mm and/or is greater than the coating thickness. Additionally, rounding segments of the peripheral side transition into each other without kinks.

12 Claims, 7 Drawing Sheets

(51) Int. Cl.
*C30B 25/08* (2006.01)
*C30B 25/12* (2006.01)

(56) References Cited

U.S. PATENT DOCUMENTS

| | | | |
|---|---|---|---|
| 2003/0205324 A1 | 11/2003 | Keeton et al. | |
| 2005/0051099 A1* | 3/2005 | Preti | C23C 16/4583 118/728 |
| 2005/0092439 A1 | 5/2005 | Keeton et al. | |
| 2005/0183669 A1* | 8/2005 | Parkhe | C23C 16/463 118/724 |
| 2008/0035632 A1* | 2/2008 | Fujita | C30B 25/12 219/634 |
| 2011/0019123 A1* | 1/2011 | Prest | G02B 7/007 349/58 |
| 2011/0027506 A1* | 2/2011 | Mittelbach | B32B 38/10 428/34.1 |
| 2011/0215071 A1 | 9/2011 | Mitrovic et al. | |
| 2014/0087127 A1* | 3/2014 | Brinkhaus | B29C 66/83221 428/116 |
| 2016/0115623 A1* | 4/2016 | Ito | H01L 21/68771 118/725 |

OTHER PUBLICATIONS

Written Opinion dated Sep. 24, 2015, from the European Patent Office, for International Patent Application No. PCT/EP2015/064363 (filed Jun. 25, 2015), 7 pages.

International Preliminary Report on Patentability dated Jan. 3, 2017, from the International Bureau of WIPO, for International Application No. PCT/EP2015/064363 (filed Jun. 25, 2015), 16 pages.

Witten Opinion dated Sep. 24, 2015, from the ISA/European Patent Office, for International Patent Application No. PCT/EP2015/064363 (filed Jun. 25, 2015), Translation, 7 pages.

* cited by examiner

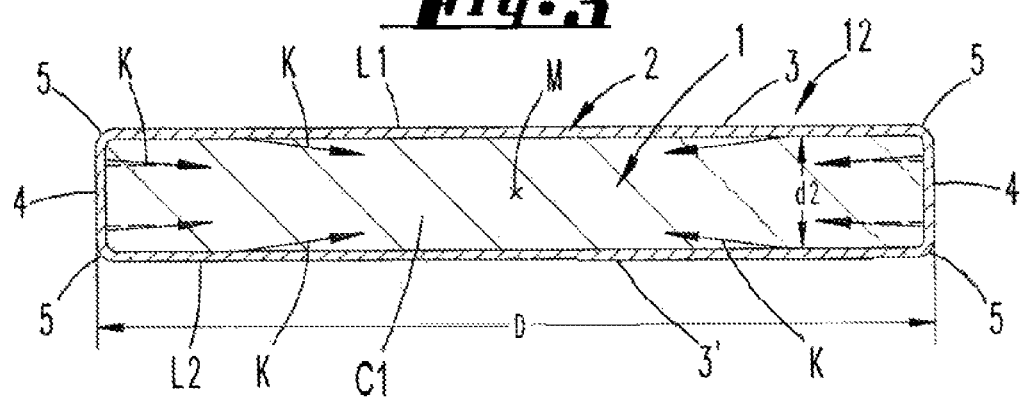
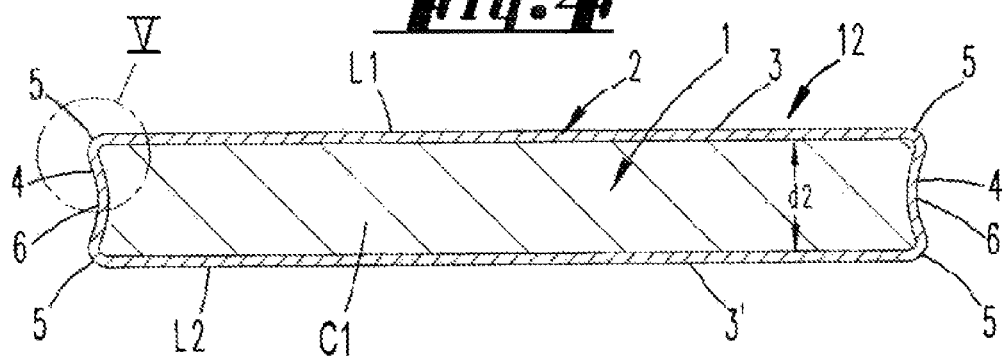
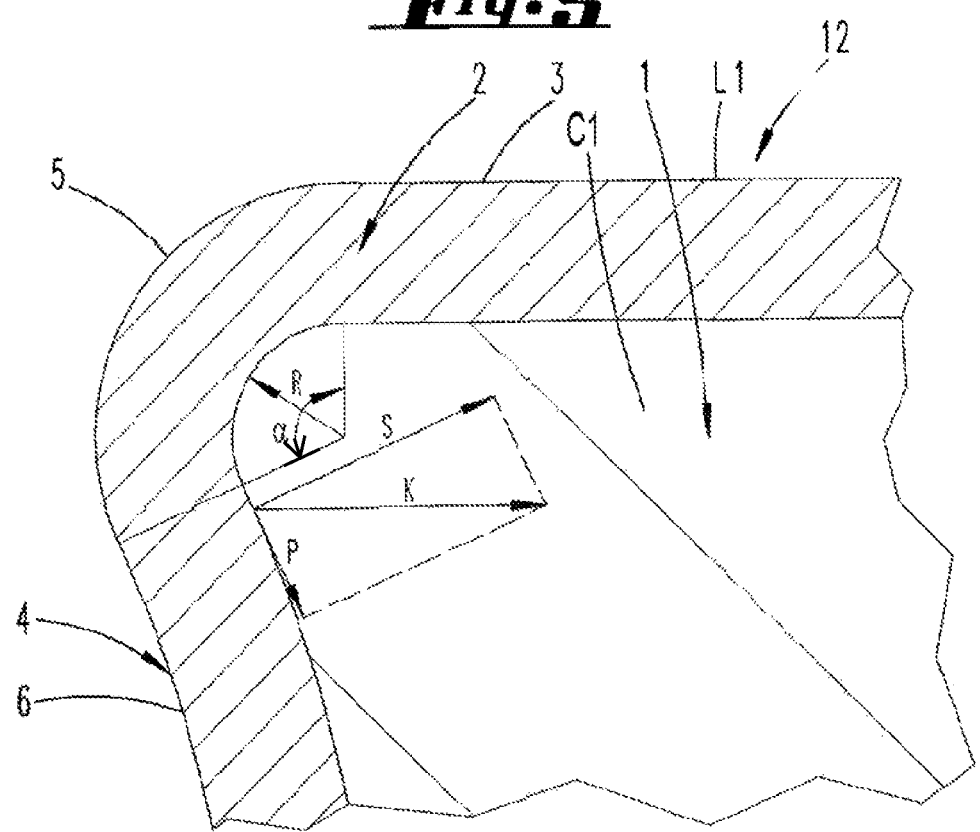

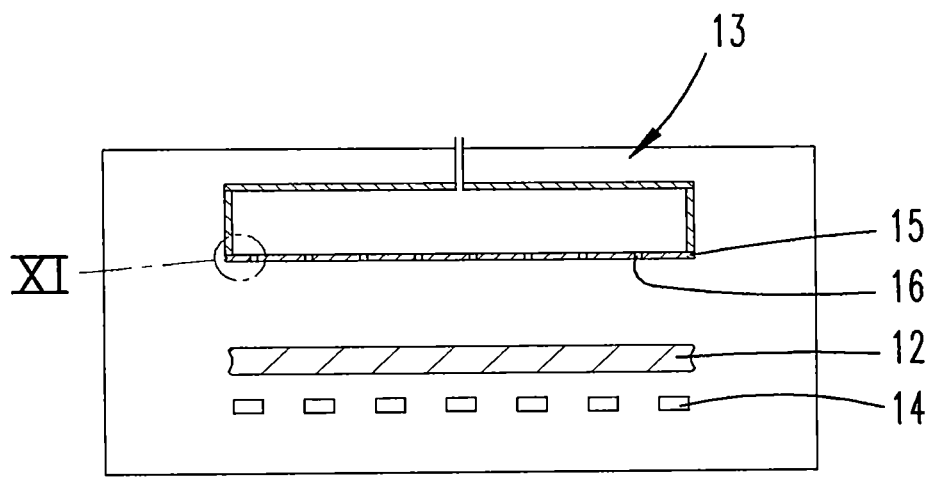
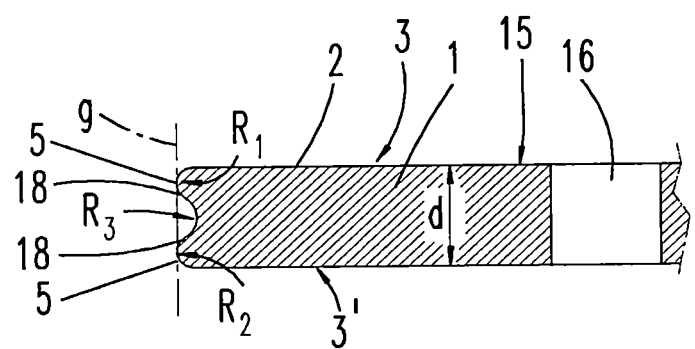

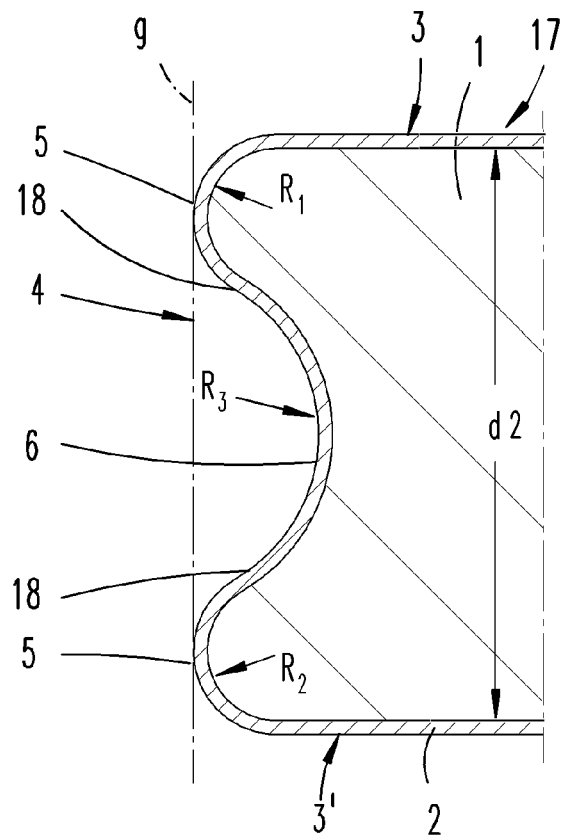
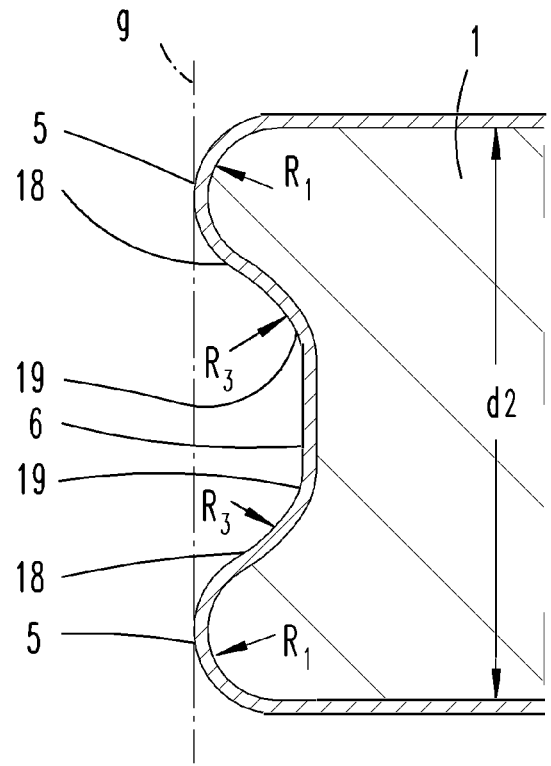

COATED FLAT COMPONENT IN A CVD REACTOR

RELATED APPLICATIONS

This application is a National Stage under 35 USC 371 of and claims priority to International Application No. PCT/EP2015/064,363, filed 25 Jun. 2015, which claims the priority benefit of DE Application No. 10 2014 109 327.5, filed 3 Jul. 2014.

FIELD OF THE INVENTION

The invention relates to a CVD reactor with a flat component or to a flat component. The component exhibits two preferably identically configured broad sides that run parallel to each other and are spaced apart from each other by a thickness, wherein an outer peripheral edge exhibits an edge rounding with an edge rounding radius and an edge rounding arc length on each broad side that adjoins an edge of an outer peripheral side, wherein the thickness is substantially less than a circle diameter that is surface-equivalent to the broad side surface, wherein the component forms a core body whose material exhibits a greater coefficient of thermal expansion than the material of a coating with which the broad sides and peripheral side are coated at a coating temperature greater than the room temperature, so that the coating exhibits a compressive stress at room temperature.

BACKGROUND

WO 2013/064613 describes a CVD reactor with a gas inlet member and a susceptor arranged therein, which is shaped like a circular disk and carries substrates during a coating process.

WO 99/43874 also describes a CVD reactor with two disk-shaped components, specifically a process chamber cover and a susceptor for accommodating the substrates to be coated in the process chamber.

FIG. 5 of US 2005/0183669 A1 describes a cap comprised of a flat cylindrical component. The cap has a coating and two broad sides that face away from each other. One broad side transitions into a peripheral surface, forming an edge rounding with a rounding arc length of 90°. The peripheral surface transitions into the second broad side, forming a bead and kink.

U.S. Pat. No. 5,837,058 describes a susceptor for a CVD device, in which a bead running on the edge transitions into a peripheral surface, forming a rounded portion.

FIG. 4 in US 2003/0205324 A1 or US 2005/0092439 A1 describes a susceptor with two broad sides facing away from each other, which each transition into a peripheral surface, forming an edge rounding. The peripheral surface has a notch extending in the peripheral direction.

SUMMARY OF THE INVENTION

As a rule, susceptors or cover plates in a CVD reactor are fabricated out of graphite. The graphite components have a flat, disk-like shape. They have two as a rule identically shaped broad sides that run parallel to each other. A cylindrical body can be involved. The thickness of the body is slight by comparison to its diameter. Apart from components that exhibit a circular outline, however, a CVD reactor also uses coated, flat components that exhibit a base area different than a circular base area. Here as well, the thickness is relatively small by comparison to a diameter, wherein the diameter is here understood as the diameter of a circle that exhibits the same base area as the broad side of the component. The graphite body is coated with a layer having a width of a few micrometers. The layer thickness of the coating is less than 1 mm. SiC or TaC or other carbides or hard materials are usually used for coating purposes. The coating is applied at temperatures in excess of 1000° C. The core body has a higher coefficient of thermal expansion than the coating, with which the broad side and peripheral side is coated. While cooling the coated component from the coating temperature down to room temperature, stresses arise within the coating. Compressive stresses are here involved. The compressive stresses result from the varying shrinkage of the layer and core body. Shrinkage takes place in the direction toward the center of gravity of the component. If a homogeneous body is involved, this is the center of mass. Otherwise, it is the center of volume. Due to the disk-like shape of the component, the peripheral edges are spaced comparatively far apart from the center of gravity, so that the highest stresses there arise in the layer or in the region of the interface between the coating and core body. A compressive stress forms inside of the coating, which shrinks by less of an extent than the core body in the cooling processes. High compressive stresses can have a long-term influence on the quality of the coating.

Therefore, the object of the invention is to take measures for making the coating more robust, in particular to reduce the critical, maximum stresses that arise in the coating at any time (at any temperature).

The object is achieved by the invention indicated in the claims.

Model calculations have shown that large edge rounding radii lead to high maximum stresses in the region of the interface between the coating and core body. This stems from the geometrically induced stability of the arc of the coating formed by the edge rounding. The arc has a relatively high stability in the radial direction. It was surprisingly found that an edge rounding with an arc length of more than 90° leads to a notable reduction in the maximum stress. A notable reduction in the maximum stress also takes place when the edge rounding radius measures roughly 1 mm or is less than 1 mm. In a preferred embodiment of a flat component in which the broad sides are identical in design, so that the component in a sense is a flat cylinder, it is advantageous if an undercut circumferential valley follows the rounded portion on the peripheral side. This valley can transition into a continuous mountain. The latter can again transition into a valley. The cross sectional contour line of the peripheral side thus preferably runs wavelike between the two broad sides. Since the components are coated in a hot state, the high stresses arise in a cooled state, i.e., at room temperature. The stresses diminish during operation, during which the component is heated to temperatures in excess of 1000° C. As a consequence, a load change takes place during each temperature change, i.e., during each use of the component. The specifications according to the invention can be used to diminish the negative influences of the frequent load changes on the service life of the component. It is advantageous for the arc length of the edge rounding to measure more than 90°, preferably more than 95°, 100°, 105°, 110°, 115° or more than 120°. The cross sectional contour line of the peripheral side has no kinks, but rather has a wave shape. The broad side of the component can be smooth in design. However, the broad side of the component can also exhibit a plurality of depressions, each for accommodating a circular disk-shaped wafer or a substrate carrier. Even the downwardly facing broad side of the component, which is a susceptor, can exhibit structuring. The same also holds true for a cover plate. It can further be provided that the component has a hole. A central hole of a circular cylindrical component can be involved. The inner wall of the opening also forms a peripheral side of the component, which is structured as already described above. It has rounded edges, wherein the rounding radius is less than or equal to 1 mm. The broad side surface transitions without kinks into the peripheral side via the edge rounding, wherein, when viewing a cross sectional surface of a straight line corresponding to the broad side surface, a continuously curved arc line follows without kinks. The broad side surface to some extent transitions smoothly into an arc line, which curves by more than 90° without changing the curvature direction before transitioning into an oppositely directed, curved section at a curvature inflection point, which either transitions into a straight section of the peripheral side or continues wavelike. The edges of a cross section (C1) of the component corresponding to the broad sides (3, 3') of the component run along two parallel lines (L1, L2) in a cross sectional plane through the component. The two parallel lines (L1, L2) correspond to the broad side surfaces, and are spaced apart from each other by less than half, preferably by less than one fourth, of their length. The ends of these lines transition into arc lines, which are allocated to the edge roundings. These arc lines preferably run on circular arcs or near-circular arcs. The peripheral length of these arcs is greater than 90°, preferably at least 95° or at least 100°. A first end of an arc adjoins a respective one of the parallel lines (L1, L2) without any kinks. The second end of the arc preferably transitions into an oppositely curved arc section, so that at least one valley forms on the peripheral surface, whose base jumps back relative to an imagined line through the vertex of second arcs. The entire periphery of the component preferably has the previously described cross section of the edge region. Due to the arc length of the rounded portion measuring in excess of 90°, a circumferential valley rounded at least in the edge region cross section arises between the two rounded peripheral edges of the broad side surfaces of the component. The thickness of the component is preferably smaller than the surface equivalent circle diameter by at least a factor of 5, preferably a factor of 10. The component can exhibit a circle cylindrical contour. However, it can also exhibit an outline deviating from the circular shape. The invention relates to the configuration of the peripheral edge of a coated component of a CVD reactor, wherein the component can involve a susceptor, a substrate holder of a susceptor placed in a pocket, a cover plate of a process chamber or the gas outlet plate of a showerhead.

BRIEF DESCRIPTION OF THE DRAWINGS

Exemplary embodiments will be described below based on the attached drawings. Shown on:

FIG. 3 is the section according to line III-III on FIG. 2, FIG. 4 is a view according to FIG. 3 of a second exemplary embodiment, FIG. 5 is a magnified view according to section V on FIG. 4, FIG. 10 is a schematic view similar to FIG. 1 of a CVD reactor with a gas inlet member 13, which exhibits a coated gas outlet plate 15 with gas outlet openings 16, FIG. 11 is the section XI on FIG. 10, FIG. 14 is a magnified view of the section XIV on FIG. 12, and FIG. 15 is another cross sectional profile similar to FIG. 11, 13, 14.

DETAILED DESCRIPTION

Figure 1:
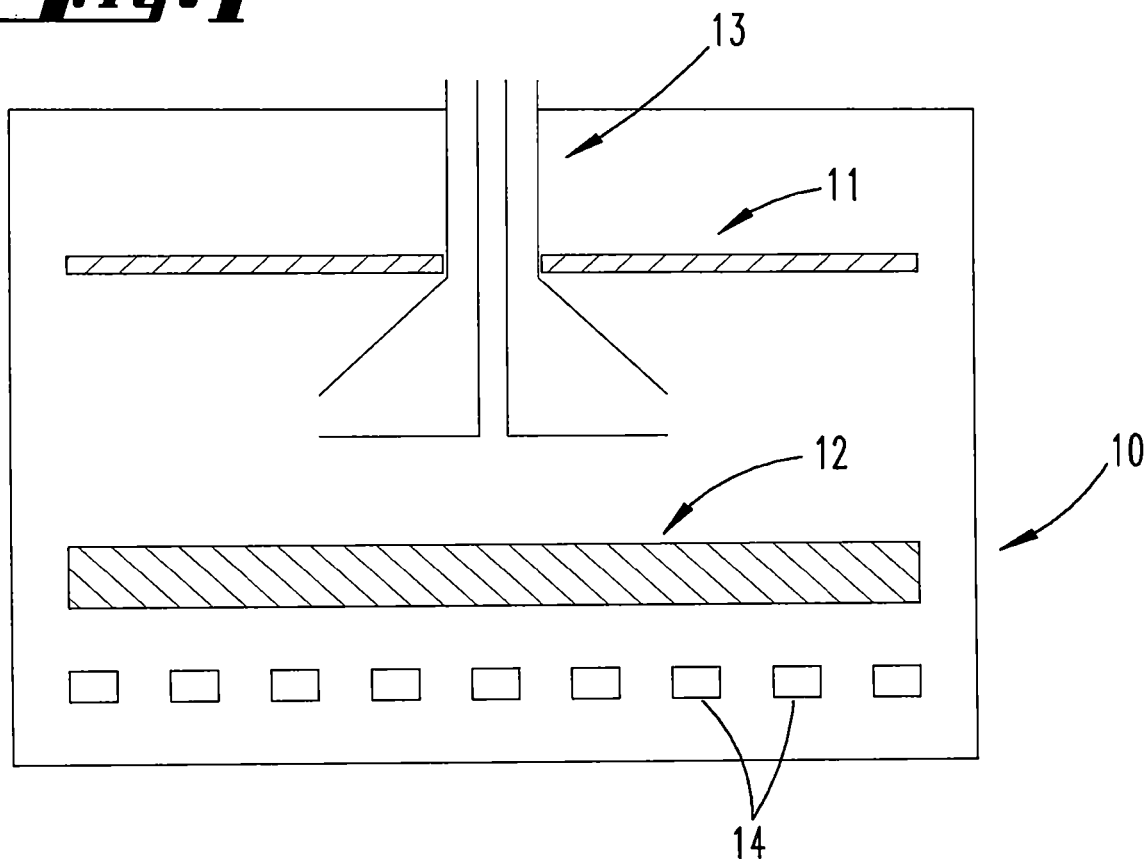
FIG. 1 is a schematic view of a CVD reactor with flat components 11, 12 arranged therein.

FIG. 1 presents a schematic view of a CVD reactor. The CVD reactor 10 has a housing in which a gas inlet member 13 is arranged, with which process gases can be fed into a process chamber of the CVD reactor 10. A process chamber 11 is comprised of a graphite part, which exhibits a hole in the middle. The graphite part has a circular disk-shaped outline contour.

Located below the cover 11 of the process chamber is a floor of the process chamber, which is comprised of a susceptor 12 that can be heated from below up to a process temperature in excess of 1000° C. by means of a heater 14. The susceptor consists of a graphite part 12 having a circular outline. The upper side of the susceptor 12 is provided with structures that form pockets for accommodating substrates.

In terms of their outline contour, the two graphite components 11, 12 have identically configured upper sides and lower sides. The components are schematically depicted on FIG. 2 or 8, wherein the edge rounding radii shown are significantly larger than intended according to the invention for purposes of clarification.

Figure 2:
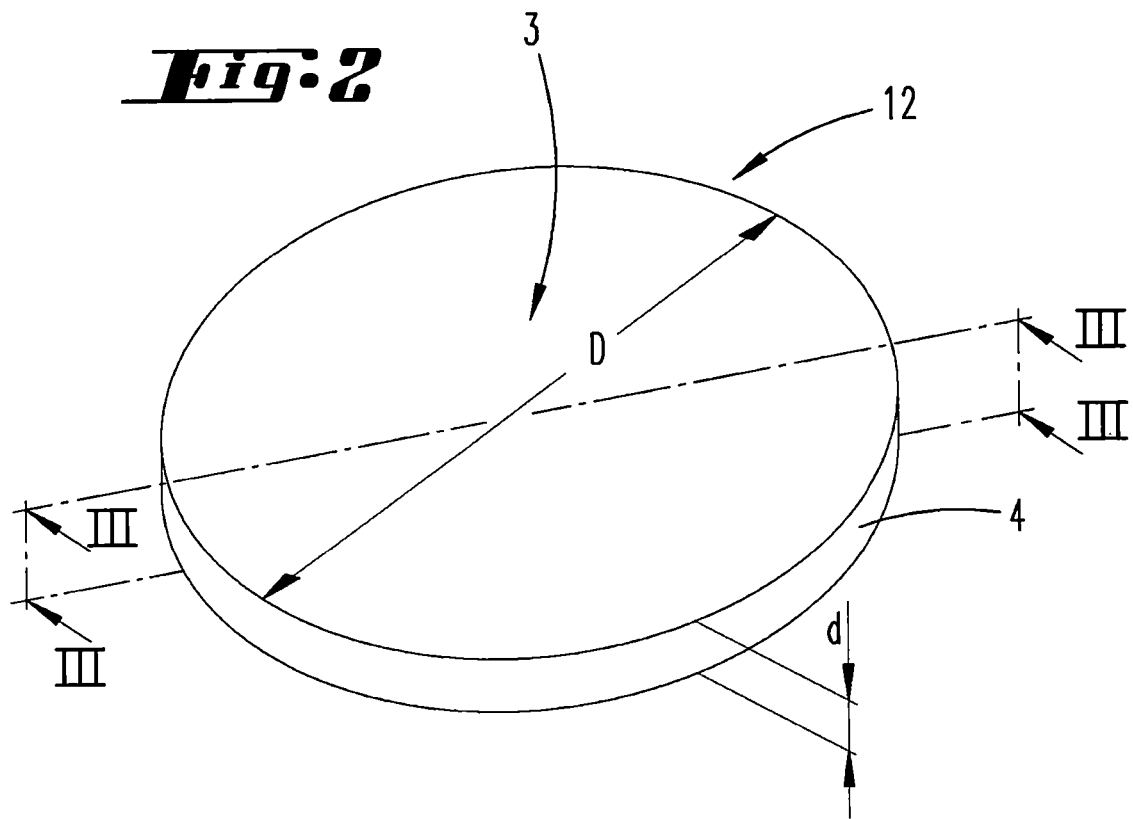
FIG. 2 is a first flat component 12 in the form of a circular cylinder.

The component shown on FIG. 2 represents a susceptor 12. Involved is a circular disk-shaped graphite body 1 with a thickness d of 1-4 cm and a diameter D of more than 20 cm, in particular of more than 30 cm. The entire outer surface of the core body 1 comprised of graphite is provided with a coating 2. Involved here is a 50 to 200 µm or 75-150 µm thick coating of SiC or TaC. The coating is applied to the core body 1 at a temperature in excess of 1000° C. Since silicon carbide or tantalum carbide have less of a thermal expansion than graphite, the graphite core body 1 shrinks to a greater extent along the line recorded on FIG. 3 and marked K in the direction toward the center of gravity M than the coating 2. This makes it easy to cup the two broad sides 3 that face away from each other and have an identical outline. A slight constriction can also be observed in the broad sides 4 while cooling the coated components 12. The thickness d2 of the core body 1 is also shown in the cross section depicted in FIG. 3.

According to the invention, the peripheral edges 5 of the component 12 are provided with a slight rounding. The rounding radius R is greater than the thickness of the coating, but measures 1 at most.

In the exemplary embodiment shown on FIGS. 4 and 5, the peripheral edge 5 exhibits a rounded portion with a rounding radius R of 1 mm. The arc length α of the edge rounding 5 is here greater than 90°. The edge rounding arc length a here has a value of about 120°. As a result, the force K that vertically acts on the peripheral side 4 and can be attributed to the shrinkage does not act on the surface vertically, but rather at an angle thereto. The force K thus splits itself into partial forces P and S, which are perpendicular to each other. The force component S acting perpendicularly to the interface between the core body 1 and coating 2 has a magnitude less than the magnitude of force K. This results in a decrease in compressive forces inside the coating or at the interface between the coating 2 and core body 1.

In the region of the edge roundings 5, a compressive stress builds up inside of the rounded coating 2 that cannot be vertically dissipated into the core body 1 via the interface between the coating 2 and core body 1. Due to the geometric stability of the arc, the forces are rather tangentially introduced into the coating sections of the broad side 3 or peripheral side 4. Reducing the rounding radius R to values less than 1 mm leads to a significant diminishment of these stresses.

Figure 6:
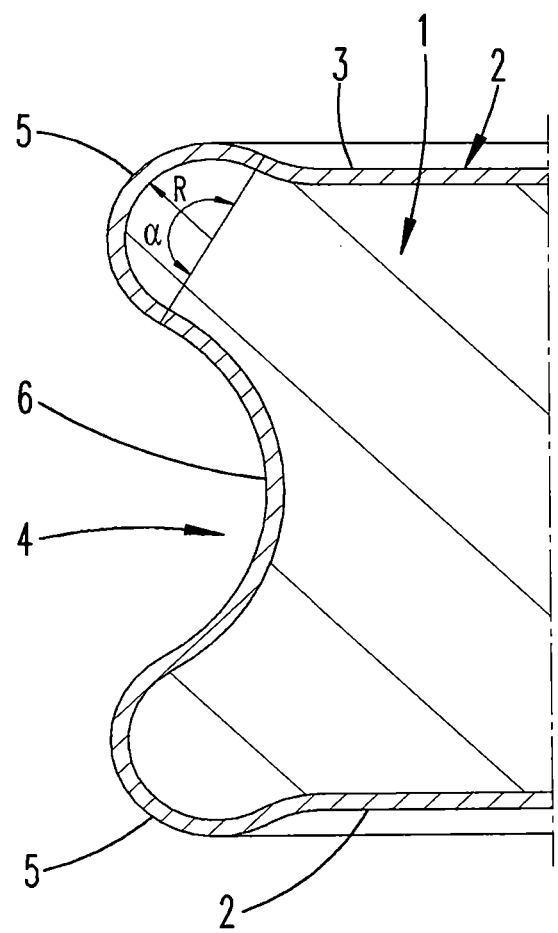
FIG. 6 is a view according to FIG. 5 of a third exemplary embodiment.

The exemplary embodiment depicted on FIG. 6 shows a component with a core part 1 comprised of graphite, which is provided with a silicon carbide coating. The peripheral edges 5 are rounded by nearly 180°. The rounded portion extends until over the plane of the broad side 3. A valley 6 forms between the two edge roundings 5, with which the peripheral side 4 transitions into the respective broad side 3.

Figure 7:
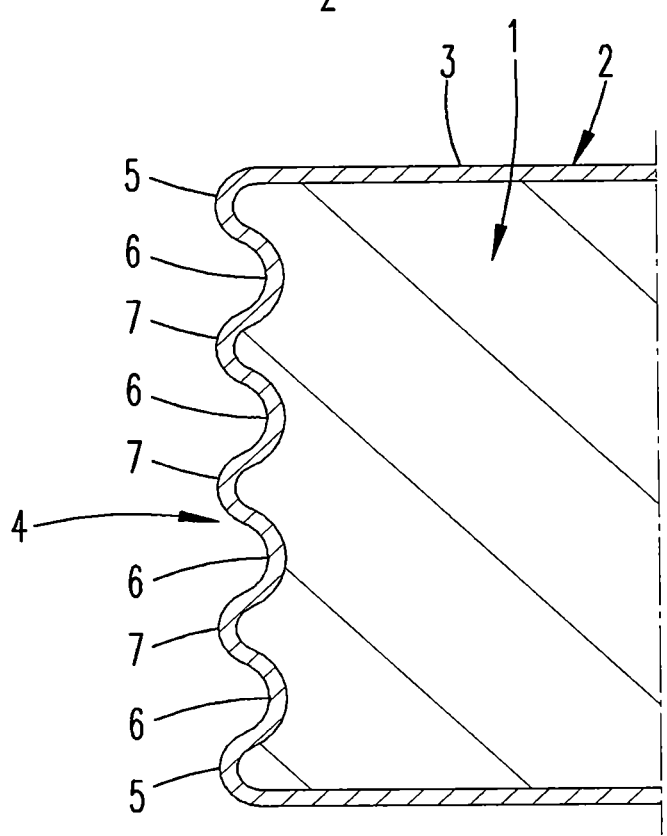
FIG. 7 is a view according to FIG. 5 of a fourth exemplary embodiment.

In the exemplary embodiment shown on FIG. 7, the cross sectional contour line of the peripheral side 4 is wavelike, so that mountains 7 and valleys 6 alternate with each other. The peripheral edge 4 runs between the two peripheral edges 5 without any kinks. Convex rounding sections go through a smooth-walled transition into concave rounding sections. This yields valleys 6 running around the component and mountains 7 lying between valleys 6 in the peripheral direction.

Figure 8:
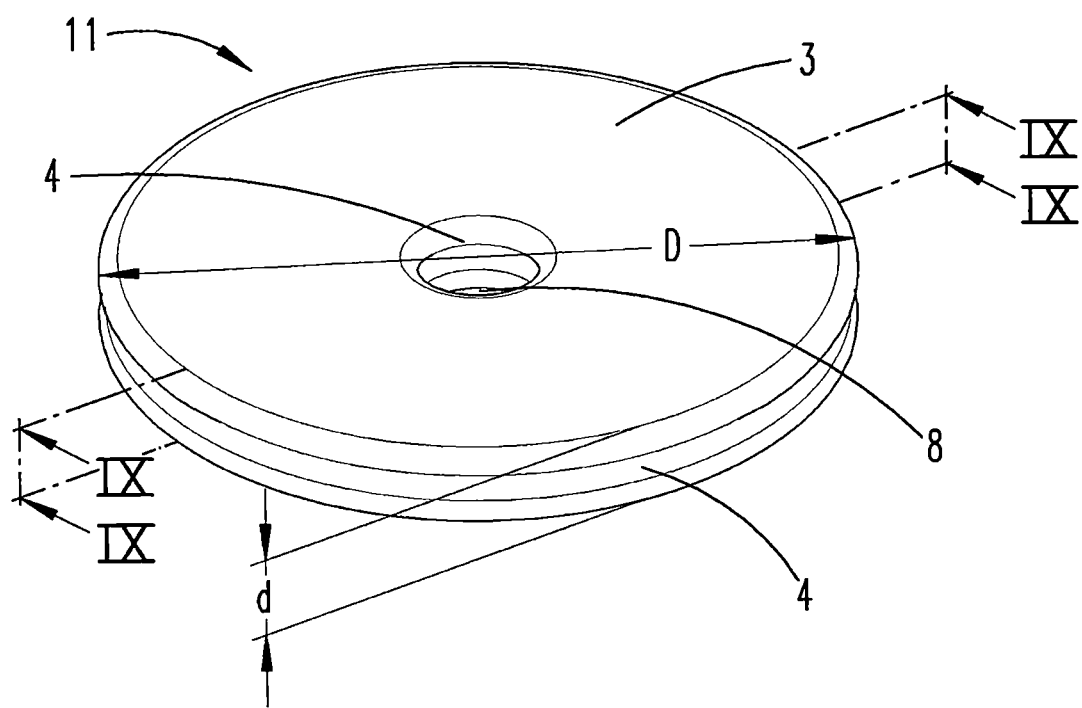
FIG. 8 is a fifth exemplary embodiment in the form of a circular disk 11 with a central hole 8.
Figure 9:
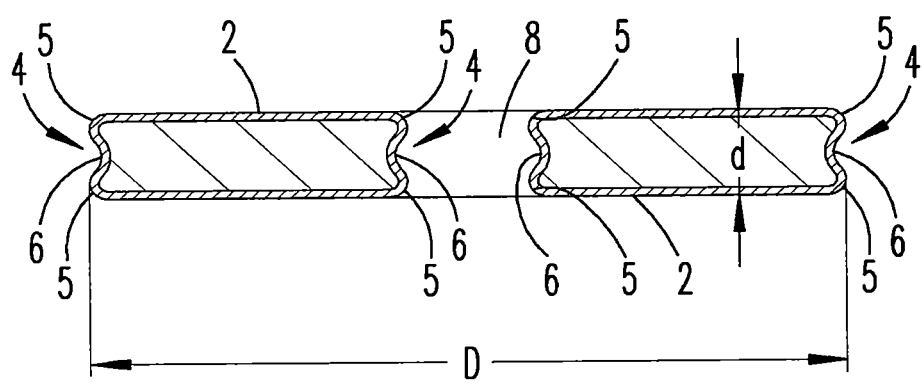
FIG. 9 is the section according to line IX-IX on FIG. 8.

FIG. 8 shows another exemplary embodiment. The component 11 is here a cover plate, which has a hole 8 in the center. The hole 8 forms a peripheral side 4 that transitions into the broad side 3 via a rounded peripheral edge 5. Here as well, a valley 6 forms between two edge roundings 5.

The invention is based on the knowledge that rounded portions should transition into the peripheral side 4 or broad side surface 2 with the formation of constrictions, or must not be larger than a minimal value. This results in a stress compensation. It is further advantageous if the individual surface sections 3, 4, 5, 6, 7 transition into each other without any kinks, i.e., smoothly with the formation of rounding zones having low rounding radii.

The exemplary embodiment describes graphite bodies that have a circular cylindrical shape. However, the invention also relates to such flat graphite bodies that exhibit a broad side outline contour that deviates from the circular shape. Here as well, the radius of the transitional region between the broad side surface and peripheral surface should be less than 1 mm, and the radius section should measure more than 90°.

FIG. 10 schematically depicts another exemplary embodiment of a process chamber of a CVD reactor with a gas inlet member 13, which is configured like a showerhead. It has a gas outlet plate 15 that consists of graphite and exhibits gas outlet openings 16. The outer peripheral surface of the gas outlet plate 15 has a cross sectional contour of the kind depicted on FIG. 11. The broad sides 3, 3' run parallel to each other at least in the edge section of the two broad sides 3, 3' lying opposite each other. The broad side surface there transitions without any respective kinks into an edge rounding 5, which has a rounding radius $R_1$, $R_2$ that measures about 1 mm. An arc section with a radius $R_3$ adjoins a transition point 18 roughly following an arc length of the edge rounding 5 of 120° without any kinks. The cross section of the edge of the gas outlet plate 15 is symmetrical in relation to a central plane that runs between the two broad sides 3, 3'. This means that the radii $R_1$, $R_2$ are the same size. The arc with radius $R_3$ adjoins the edge rounding 5 with radius $R_2$ at a transition point 18. An imagined line g placed through the vertices of the edge roundings 5 spans a valley 6, whose floor is formed by radius $R_3$.

The process chamber shown on FIG. 10 has a susceptor 12, which can be heated from below by means of a heater 14. The peripheral side 4 of the susceptor 12 can exhibit a contour of the kind shown in the cross sectional views on FIGS. 11, 13, 14 and 15.

Figure 12:
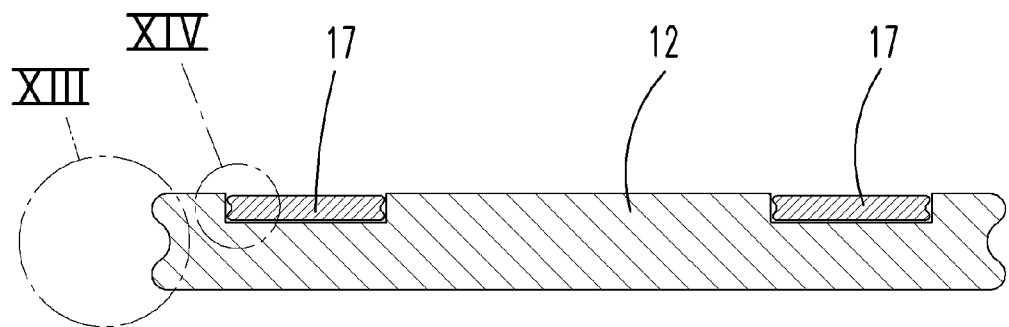
FIG. 12 is a coated susceptor 12 with pockets, in which coated substrate carriers 17 are arranged.
Figure 13:
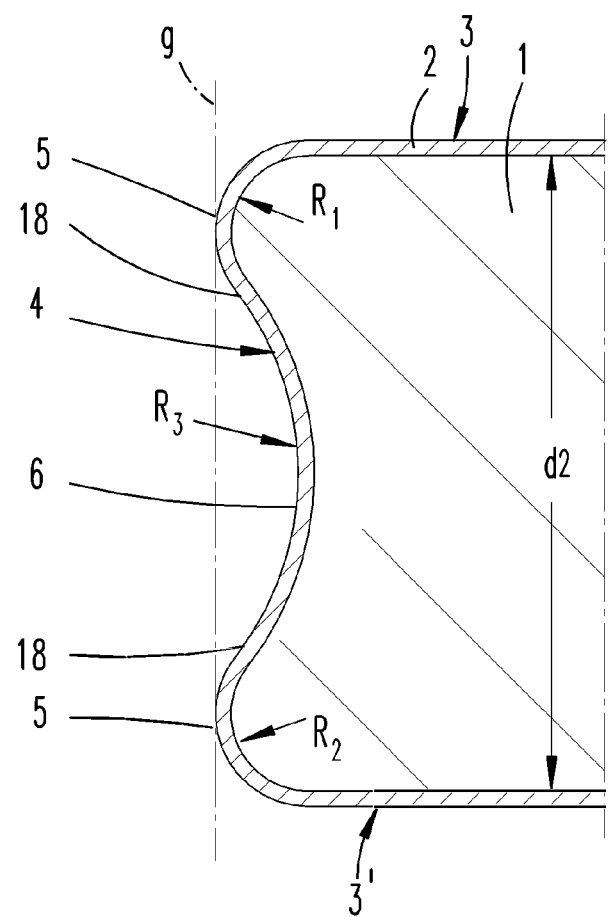
FIG. 13 is a magnified view of the section XIII on FIG. 12.

FIG. 12 shows another exemplary embodiment of a susceptor, in which substrate carriers 17 are inserted into pockets of the susceptor 12. The substrate carriers 17 are rotary driven by a gas flow during the coating operation, and held on a gas bearing generated by the gas flow. FIG. 13 shows the edge cross section of the susceptor 12, and FIG. 14 shows the edge cross section of the substrate carrier 17. As evident from FIGS. 13 and 14, the cross section of the peripheral side 4 consists of three arcs arranged one behind the other, wherein the arcs with radii $R_1$, $R_2$, $R_3$ transition one into the other without kinks at transition points 18. Radii $R_1$, $R_2$ measure about 1 mm. Radius $R_3$ depends on the thickness d2 of the core 1, which is coated with an at most 0.5 mm thick coating 2, and can be significantly greater than radii $R_1$ and $R_2$. Radius $R_3$ can lie between 8 and 9 mm given a component thickness of 13 cm. The cross sectional radius of the valley 6 between the two edge roundings 5 can thus preferably be five times larger than the edge rounding radius. In addition, the radius $R_3$ is selected in such a way as to yield a transition point 18, in which only the direction of curvature changes, with the contour lines otherwise transitioning into each other without any kinks.

The exemplary embodiment shown on FIG. 15 presents a variant in which oppositely curved arcs with radii $R_3$ adjoin the respective edge roundings 5, and transition into a valley 6 that runs along a straight line, wherein the flat valley 6 transitions into the hollow rounded portion with the radius $R_3$ without any kinks at transition points 19.

The above statements serve to explain the inventions encompassed by the application as a whole, which each independently further develop the prior art by at least the following feature combinations, specifically:

A CVD reactor, characterized in that the edge rounding arc length α is greater than 90° to reduce the stress between the coating 2 and core body 1.

A component for use in a CVD reactor, characterized in that the edge rounding arc length α is greater than 90° to reduce the stress between the coating 2 and core body 1.

A CVD reactor or component, characterized in that the coating is SiC, TaC or another hard material.

A CVD reactor or component, characterized in that the edge rounding radius R measures at most 1 mm and/or exceeds the thickness of the coating 2.

A CVD reactor or component, characterized in that the core body 1 consists of graphite.

A CVD reactor or component, characterized in that the coating 2 was applied at a temperature of >1000° C.

A CVD reactor or component, characterized in that the peripheral side 4 exhibits rounding sections that transition into each other without any kinks and form at least one valley 6.

A CVD reactor or component, characterized in that the peripheral side 4 is formed exclusively by circular arc sections in cross section.

A CVD reactor or component, characterized in that the component 11, 12 is a susceptor 12 or a cover plate 11, a substrate carrier 17 or a gas outlet plate 15 of a gas inlet member 13.

A CVD reactor or component according to one of the preceding claims, characterized in that the component 11, 12 exhibits a circle cylindrical shape, and in particular exhibits a diameter D of at least 20 cm, in particular at least 30 cm, and a thickness d of between 1 and 3 cm.

A CVD reactor or component, characterized in that the component 11, 12 exhibits an outline that deviates from the circular shape.

A CVD reactor or component, characterized in that, in a cross sectional plane through the component 11, 12, 15, 17, the cross section of the component exhibits two lines running parallel to each other at least near the edge of the component, which correspond to the edge regions of the broad sides 3, 3' of the component 11, 12, 15, 17, and the ends of these lines transition without any kinks into arc lines, which correspond to edge roundings 5, wherein the arc lines run on a circular arc or near-circular arc, and a curved connecting line joins the arc lines with each other without any kinks, and forms at least one valley 6, which jumps back relative to a straight line drawn through the vertices of the arc lines.

A CVD reactor or component, characterized in that the peripheral side 4 is formed in cross section exclusively by circular arc lines with radii $R_1$, R, $R_3$ that are arranged one behind the other.

All disclosed features are essential to the invention, whether taken separately or in combination with each other. The disclosure of the invention therewith also includes the disclosure content of the accompanying/attached priority documents (copy of preliminary application) in its entirety, even for the purpose of also incorporating features of these documents into claims of the present application. The features in the subclaims characterize independent inventive further developments of prior art, in particular so as to initiate partial applications based upon these claims.

| Reference List: | | | |
|---|---|---|---|
| 1 | Core body | α | Arc length |
| 2 | Coating | d | Thickness |
| 3, 3' | Broad side | d2 | Thickness |
| 4 | Peripheral side | g | Straight line |
| 5 | Peripheral edge, edge rounding | | |
| 6 | Valley | | |
| 7 | Mountain | D | Circular diameter |
| 8 | Hole | K | Force |
| 10 | CVD reactor | P | Partial forces |
| 11 | Cover plate | R1 | Radius |
| 12 | Susceptor | R2 | Radius |
| 13 | Gas inlet member | R3 | Radius |
| 14 | Heater | S | Partial forces |
| 15 | Gas outlet plate | M | Center of gravity |
| 16 | Gas outlet opening | | |
| 17 | Substrate carrier | | |
| 18 | Transition point | | |
| 19 | Transition point | | |

What is claimed is:

1. A chemical vapor deposition (CVD) reactor with a flat component (11, 12), wherein the flat component comprises:
   a core body (1);
   a coating (2) that coats an outer surface of the core body (1);
   a first broad, flat and smooth side (3);
   a second broad, flat and smooth side (3'), wherein the first and second broad, flat and smooth sides (3, 3') run parallel to each other and are spaced apart from each other by a thickness (d) of the flat component (11, 12);
   an outer peripheral side (4);
   a first edge rounding (5) formed between the first broad, flat and smooth side (3) and the outer peripheral side (4) of the flat component (11, 12); and
   wherein a second edge rounding (5) is formed between the second broad, flat and smooth side (3') and the outer peripheral side (4) of the flat component (11, 12),
   wherein each of the first and second roundings (5) comprises an edge rounding radius (R),
   wherein the outer peripheral side (4), the first edge rounding (5) and the second edge rounding (5) each wraps around a circumference of the flat component (11, 12),
   wherein the thickness (d) of the flat component (11, 12) is substantially less than a diameter (D) of the flat component (11, 12),
   wherein a material of the core body (1) exhibits a greater thermal expansion coefficient than a material of the coating (2), the coating (2) being formed at a temperature greater than room temperature causing the coating (2) to exhibit a compressive stress at room temperature,
   wherein, in a cross sectional plane through the flat component (11, 12), an entirety of an edge of a cross section (C1) of the flat component (11, 12) corresponding to the first broad, flat and smooth side (3) runs along a first straight line (L1), an entirety of an edge of the cross section (C1) of the flat component (11, 12) corresponding to the second broad, flat and smooth side (3') runs along a second straight line (L2), wherein the first and second straight lines (L1, L2) are parallel to one another,
   wherein the edge of the cross section (C1) of the flat component (11, 12) corresponding to the first broad, flat and smooth side (3) transitions into a first arc line corresponding to the first edge rounding (5), and the edge of the cross section (C1) of the flat component (11, 12) corresponding to the second broad, flat and smooth side (3') transitions into a second arc line corresponding to the second edge rounding (5),
   wherein an arc length (a) of each of the first and second arc lines is greater than 90° to reduce the compressive stress between the coating (2) and the core body (1),
   wherein each of the first edge rounding (5) and the second edge rounding (5) transition without any kinks into a circumferential valley (6) along the outer peripheral side (4), wherein the circumferential valley (6) forms a depression, in the outer peripheral side (4), that wraps around the flat component (11, 12) along the circumference of the flat component (11, 12),
   wherein a first end of the first arc line is joined with the edge of the cross section (C1) of the flat component (11, 12) corresponding to the first broad, flat and smooth side (3) and a second end of the first arc line is joined with the circumferential valley (6), and
   wherein a first end of the second arc line is joined with the edge of the cross section (C1) of the flat component (11, 12) corresponding to the second broad, flat and smooth side (3') and a second end of the second arc line is joined with the circumferential valley (6).

2. A flat component (11, 12) for use in a chemical vapor deposition (CVD) reactor, the flat component comprising:
   a core body (1);

a coating (2) that coats an outer surface of the core body (1);
a first broad, flat and smooth side (3);
a second broad, flat and smooth side (3'), wherein the first and second broad, flat and smooth sides (3, 3') that run parallel to each other and are spaced apart from each other by a thickness (d) of the flat component (11, 12);
an outer peripheral side (4);
a first edge rounding (5) formed between the first broad, flat and smooth side (3) and the outer peripheral side (4) of the flat component (11, 12); and
a second edge rounding (5) formed between the second broad, flat and smooth side (3') and the outer peripheral side (4) of the flat component (11, 12),
wherein each of the first and second edge roundings (5) comprises an edge rounding radius (R),
wherein the outer peripheral side (4), the first edge rounding (5) and the second edge rounding (5) each wraps around a circumference of the flat component (11, 12),
wherein the thickness (d) of the flat component (11, 12) is substantially less than a diameter (D) of the flat component (11, 12),
wherein a material of the core body (1) exhibits a greater thermal expansion coefficient than a material of the coating (2), the coating (2) being formed at a temperature greater than room temperature causing the coating (2) to exhibit a compressive stress at room temperature,
wherein, in a cross sectional plane through the flat component (11, 12), an entirety of an edge of a cross section (C1) of the flat component (11, 12) corresponding to the first broad, flat and smooth side (3) runs along a first straight line (L1), and an entirety of an edge of the cross section (C1) of the flat component (11, 12) corresponding to the second broad, flat and smooth side (3') runs along a second straight line (L2), wherein the first and second straight lines (L1, L2) are parallel to one another,
wherein the edge of the cross section (C1) of the flat component (11, 12) corresponding to the first broad, flat and smooth side (3) transitions into a first arc line corresponding to the first edge rounding (5), and the edge of the cross section (C1) of the flat component (11, 12) corresponding to the second broad, flat and smooth side (3') transitions into a second arc line corresponding to the second edge rounding (5),
wherein an arc length (a) of each of the first and second arc lines is greater than 90° to reduce the compressive stress between the coating (2) and the core body (1),
wherein each of the first edge rounding (5) and the second edge rounding (5) transition without any kinks into a circumferential valley (6) along the outer peripheral side (4), wherein the circumferential valley (6) forms a depression, in the outer peripheral side (4), that wraps around the flat component (11, 12) along the circumference of the flat component (11, 12),
wherein a first end of the first arc line is joined with the edge of the cross section (C1) of the flat component (11, 12) corresponding to the first broad, flat and smooth side (3) and a second end of the first arc line is joined with the circumferential valley (6), and
wherein a first end of the second arc line is joined with the edge of the cross section (C1) of the flat component (11, 12) corresponding to the second broad, flat and smooth side (3') and a second end of the second arc line is joined with the circumferential valley (6).

3. The CVD reactor of claim 1, wherein the coating comprises SiC, TaC or another hard material.

4. The CVD reactor of claim 1, wherein the edge rounding radius (R) measures at most 1 mm and/or exceeds a thickness of the coating (2).

5. The CVD reactor of claim 1, wherein the core body (1) consists of graphite.

6. The CVD reactor of claim 1, wherein the coating (2) is formed at a temperature greater than 1000° C.

7. The CVD reactor of claim 1, wherein a cross section of the outer peripheral side (4) consists of circular arc sections.

8. The CVD reactor of claim 1, wherein the flat component (11, 12) is a susceptor (12), a cover plate (11), a substrate carrier (17) or a gas outlet plate (15) of a gas inlet member (13).

9. The CVD reactor of claim 1, wherein the diameter (D) of the flat component (11, 12) is at least 20 cm, and the thickness (d) of the flat component (11, 12) is between 1 and 3 cm.

10. The CVD reactor of claim 1, wherein a cross section of the outer peripheral side (4) consists of circular arc lines with respective radii (R1, R2, R3).

11. A chemical vapor deposition (CVD) reactor with a flat component (11, 12), wherein the flat component comprises:
a core body (1);
a coating (2) that coats an outer surface of the core body (1);
a first broad, flat and smooth side (3);
a second broad, flat and smooth side (3'), wherein the first and second broad, flat and smooth sides (3, 3') run parallel to each other and are spaced apart from each other by a thickness (d) of the flat component (11, 12);
an outer peripheral side (4);
a first edge rounding (5) formed between the first broad, flat and smooth side (3) and the outer peripheral side (4) of the flat component (11, 12); and
a second edge rounding (5) is formed between the second broad, flat and smooth side (3') and the outer peripheral side (4) of the flat component (11, 12),
wherein each of the first and second roundings (5) comprises an edge rounding radius (R),
wherein the outer peripheral side (4), the first edge rounding (5) and the second edge rounding (5) each wraps around a circumference of the flat component (11, 12),
wherein the thickness (d) of the flat component (11, 12) is substantially less than a diameter (D) of the flat component (11, 12),
wherein a material of the core body (1) exhibits a greater thermal expansion coefficient than a material of the coating (2), the coating (2) being formed at a temperature greater than room temperature causing the coating (2) to exhibit a compressive stress at room temperature,
wherein, in a cross sectional plane through the flat component (11, 12), an entirety of an edge of a cross section (C1) of the flat component (11, 12) corresponding to the first broad, flat and smooth side (3) runs along a first straight line (L1), an entirety of an edge of the cross section (C1) of the flat component (11, 12) corresponding to the second broad, flat and smooth side (3') runs along a second straight line (L2), wherein the first and second straight lines (L1, L2) are parallel to one another,
wherein the edge of the cross section (C1) of the flat component (11, 12) corresponding to the first broad, flat and smooth side (3) transitions into a first arc line corresponding to the first edge rounding (5), and the edge of the cross section (C1) of the flat component (11, 12) corresponding to the second broad, flat and smooth side (3') transitions into a second arc line corresponding to the second edge rounding (5), wherein an arc length (a) of each of the first and second arc lines is greater than 90° to reduce the compressive stress between the coating (2) and the core body (1), wherein the first edge rounding (5) transitions without any kinks into a first circumferential valley (6) along the outer peripheral side (4), wherein the first circumferential valley (6) forms a first depression, in the outer peripheral side (4), that wraps around the flat component (11, 12) along the circumference of the flat component (11, 12), wherein the second edge rounding (5) transitions without any kinks into a second circumferential valley (6) along the outer peripheral side (4), wherein the second circumferential valley (6) forms a second depression, in the outer peripheral side (4), that wraps around the flat component (11, 12) along the circumference of the flat component (11, 12), wherein a first end of the first arc line is joined with the edge of the cross section (C1) of the flat component (11, 12) corresponding to the first broad, flat and smooth side (3) and a second end of the first arc line is joined with the first circumferential valley (6), and wherein a first end of the second arc line is joined with the edge of the cross section (C1) of the flat component (11, 12) corresponding to the second broad, flat and smooth side (3') and a second end of the second arc line is joined with the second circumferential valley (6).

12. A flat component (11, 12) for use in a chemical vapor deposition (CVD) reactor, the flat component comprising:
a core body (1);
a coating (2) that coats an outer surface of the core body (1);
a first broad, flat and smooth side (3);
a second broad, flat and smooth side (3'), wherein the first and second broad, flat and smooth sides (3, 3') run parallel to each other and are spaced apart from each other by a thickness (d) of the flat component (11, 12);
an outer peripheral side (4);
a first edge rounding (5) formed between the first broad, flat and smooth side (3) and the outer peripheral side (4) of the flat component (11, 12); and
a second edge rounding (5) is formed between the second broad, flat and smooth side (3') and the outer peripheral side (4) of the flat component (11, 12),
wherein each of the first and second roundings (5) comprises an edge rounding radius (R),
wherein the outer peripheral side (4), the first edge rounding (5) and the second edge rounding (5) each wraps around a circumference of the flat component (11, 12), wherein the thickness (d) of the flat component (11, 12) is substantially less than a diameter (D) of the flat component (11, 12), wherein a material of the core body (1) exhibits a greater thermal expansion coefficient than a material of the coating (2), the coating (2) being formed at a temperature greater than room temperature causing the coating (2) to exhibit a compressive stress at room temperature, wherein, in a cross sectional plane through the flat component (11, 12), an entirety of an edge of a cross section (C1) of the flat component (11, 12) corresponding to the first broad, flat and smooth side (3) runs along a first straight line (L1), an entirety of an edge of the cross section (C1) of the flat component (11, 12) corresponding to the second broad, flat and smooth side (3') runs along a second straight line (L2), wherein the first and second straight lines (L1, L2) are parallel to one another, wherein the edge of the cross section (C1) of the flat component (11, 12) corresponding to the first broad, flat and smooth side (3) transitions into a first arc line corresponding to the first edge rounding (5), and the edge of the cross section (C1) of the flat component (11, 12) corresponding to the second broad, flat and smooth side (3') transitions into a second arc line corresponding to the second edge rounding (5), wherein an arc length (a) of each of the first and second arc lines is greater than 90° to reduce the compressive stress between the coating (2) and the core body (1), wherein the first edge rounding (5) transitions without any kinks into a first circumferential valley (6) along the outer peripheral side (4), wherein the first circumferential valley (6) forms a first depression, in the outer peripheral side (4), that wraps around the flat component (11, 12) along the circumference of the flat component (11, 12), wherein the second edge rounding (5) transitions without any kinks into a second circumferential valley (6) along the outer peripheral side (4), wherein the second circumferential valley (6) forms a second depression, in the outer peripheral side (4), that wraps around the flat component (11, 12) along the circumference of the flat component (11, 12), wherein a first end of the first arc line is joined with the edge of the cross section (C1) of the flat component (11, 12) corresponding to the first broad, flat and smooth side (3) and a second end of the first arc line is joined with the first circumferential valley (6), and wherein a first end of the second arc line is joined with the edge of the cross section (C1) of the flat component (11, 12) corresponding to the second broad, flat and smooth side (3') and a second end of the second arc line is joined with the second circumferential valley (6).

* * * * *